United States Patent
Ovadia et al.

(10) Patent No.: US 6,549,403 B1
(45) Date of Patent: Apr. 15, 2003

(54) METHOD AND APPARATUS FOR MANAGING THERMAL ENERGY EMISSIONS OF A REMOVABLE POINT-OF-DEPLOYMENT MODULE IN A CABLE-READY TELEVISION SET

(75) Inventors: Shlomo Ovadia, Yardley, PA (US); Steven Kimball, Leucadia, CA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/515,708

(22) Filed: Feb. 29, 2000

Related U.S. Application Data

(63) Continuation-in-part of application No. 09/450,342, filed on Nov. 29, 1999.

(51) Int. Cl.⁷ ................................................. H05K 7/20
(52) U.S. Cl. ........................ 361/692; 361/709; 361/725; 361/727; 165/185; 174/16.3
(58) Field of Search ................................. 361/683, 685, 361/687–692, 704, 707, 709–711, 719–720, 725, 727, 784, 790; 257/722, 718–719, 726–727; 165/185; 174/16.3

(56) References Cited

U.S. PATENT DOCUMENTS

| 5,426,701 A | 6/1995 | Herrmann et al. ............ 380/52 |
| 6,278,609 B1 * | 8/2001 | Suzuki et al. ............... 361/704 |

* cited by examiner

*Primary Examiner*—Darren Schuberg
*Assistant Examiner*—Michael Datskovsky
(74) *Attorney, Agent, or Firm*—Steven L. Nichols; Ronald P. Kananen; Rader, Fishman & Grauer PLLC

(57) ABSTRACT

If the circuitry for processing television and other data signals conventionally contained in a set-top terminal is incorporated directly into a television set, heat from a removable point-of-deployment module inserted into the television set to connect with that circuitry can be primarily dissipated by providing a guide of a thermally conductive material that is in contact with both the module and the electromagnetic interference shield of the television set. This applies in either a cathode ray tube television set or a flat panel display television set. In a flat panel television set, the interference shield takes the form of a shield bracket, which is also used to support the flat panel display. In either case, heat generated by the module is conducted to the shield or shield bracket and then released by convection. Alternatively, the module can, in either case, be installed in direct physical contact with the shield or shield bracket.

21 Claims, 2 Drawing Sheets

-PRIOR ART-

METHOD AND APPARATUS FOR MANAGING THERMAL ENERGY EMISSIONS OF A REMOVABLE POINT-OF-DEPLOYMENT MODULE IN A CABLE-READY TELEVISION SET

RELATED APPLICATIONS

This application is a continuation-in-part of U.S. Application Ser. No. 09/450,342 filed Nov. 29, 1999 which is incorporated herein by reference in its entirety.

FIELD OF THE INVENTION

The present invention relates to the field of cable television. More particularly, the present invention relates to the field of thermal energy management for thermal energy produced by a removable module inserted into a cable-ready television set where the module is connected to circuitry integrated into the television set that handles the connection between the television set and the cable television system in the manner of a conventional set-top terminal.

BACKGROUND OF THE INVENTION

Cable television systems allow subscribers access to dozens or even hundreds of channels of television programming. This wide variety of programming accounts for the great popularity of cable television. Additionally, the current trend is for cable television systems to provide additional services such as premium channels, pay-per-view programming, video-on-demand programming and even internet access.

In advanced cable television systems, each subscriber is typically provided with a set-top terminal. The set-top terminal is a box of electronic equipment that is used to connect the subscriber's television, or other electronic equipment, to the cable television system. The set-top terminal processes the signal received from the cable television system to provide the services of the cable system to subscribers.

As the premium services of the cable television system expand, security techniques for those premium services become crucial to ensure that only subscribers who have paid for the premium services have access to them. For example, premium channels, such as some movie channels, are scrambled before transmission to prevent unauthorized reception and viewing of those channels. Subscribers who pay additional fees to receive the premium channel or channels are provided with the means to descramble and view the premium channel or channels.

There are many techniques for controlling the remote descrambling of scrambled television signals. Typically a system subscriber who has paid to receive the scrambled premium channel or channels is provided with a descrambler unit that is connected between the source of the television signal (e.g., a cable feed or a satellite receiver) and the subscriber's television set. While this descrambler unit may be a self-contained unit, descrambling circuitry is frequently and preferably incorporated into the subscriber's set-top terminal.

Unfortunately, proprietary algorithms used by descrambling circuitry can frequently, with enough effort, be "broken" or duplicated by an unauthorized party. Thereafter, unauthorized means of descrambling the cable system's premium channels might become available. To avoid this, the operator of the cable system may need to periodically change the proprietary algorithm used to scramble and descramble the premium channels.

If the subscriber's descrambling circuitry is incorporated in a set-top terminal, the old descrambling circuitry must be removed and new descrambling circuitry inserted. To facilitate this process, removable modules that carry the descrambling circuitry can be provided to plug into a port of the set-top box. These removable modules are also known as point-of-deployment (POD) modules.

When the descrambling circuitry is to be changed or upgraded, the old removable module can be pulled from the set-top box, and a module with the new circuitry is inserted in the port. Other electronic elements or programming of the set-top terminal which need to be updated periodically can also be provided in the removable module.

A removable module, like that described above, typically has a programmable circuit that contains the proprietary algorithm used by the set-top box for decrypting or descrambling purposes. This programmable circuit typically includes a memory section, for example, Static Random Access Memory (SRAM) chips or the like, forming a confidential or secured portion of the removable module memory in which, for example, the proprietary algorithm can be stored.

The removable module may be about the size and shape of a credit card and is meant to be removed only when the cable television company providing the services decides to update or change the proprietary decrypting algorithm. Such a change may occur regularly as a security precaution, when improved security or other features become available for inclusion in the set-top boxes, or may be made only after the decrypting algorithm has been broken by an unauthorized user. Additionally, the inadvertent removal of the removable module typically renders the set-top box non-functional.

It is known to add a port in the top or in one side of a set-top box into which the removable module is plugged. However some problems arise when a removable module is mounted in a port in the side or top of a set-top box. For example, the removable module so mounted is easily accessible to children and others who may remove the module without the knowledge of the subscriber. The removable module so mounted is also susceptible to an inadvertent removal or bumping which can cause the set-top box to become non-functional.

Moreover, as noted above, the current trend is for the amount and diversity of services provided by cable television companies to expand to include, for example, the transmission of computer data, a greater quantity of television programming and, eventually, telephone calls. To accommodate the existing and new services, set-top terminals will eventually require many more ports than presently exist. This will reduce the space available for including a separate port for a removable module.

A solution to these problems is disclosed in U.S. Pat. No. 5,426,701 issued Jun. 20, 1995 to Herrmann et al. In that patent, a port for a removable module is located underneath the set-top box. Accessible from the rear of the set-top terminal, the credit-card shaped removable module is slid into a groove in the underside of the set-top terminal to plug into a port provided there. A substantial portion of the removable module may be inserted into the casing of the set-top terminal in order to plug the module into its port. Additionally, a door or access cover may be provided to completely enclosed the module in the housing of the set-top box by closing over the groove on the underside of the set-top terminal to cover the removable module after it is plugged into its port Placing the removable module underneath and, perhaps, inside the casing of the set-top terminal, however, contributes to other problems in the design of the set-top box. Specifically, the electronic circuitry of the removable module inherently generates heat or thermal energy during operation. This thermal energy must be dissipated to prevent accumulation and overheating that may damage or be detrimental to the module or the set-top box. Adequate dissipation of thermal energy has been a problem in previous set-top boxes.

FIG. 1 shows a conventional thermal energy management scheme for a settop box (105) that includes a removable module (100). As shown in FIG. 1, the removable module (100) is inserted in a port (104). Within the port (104), the module (100) is connected to a module connector (101). The module connector (101) is, in turn, connected to the printed wire assembly (PWA) (102), i.e., the circuitry, within the set-top box (105). The module connector (101) provides electronic communication between the module (100) and the circuitry (102) of the set-top box (105) so that the circuitry (102) of the set-top box (105) can make use of the data, such as a proprietary security algorithm, or processing capabilities of the module (100).

The module connector (101) also provides the primary path through which thermal energy is dissipated from the removable module (100). The physical connection between the module connector (101) and the module (100) provides a conduction path (110) over which thermal energy leaves the module (100).

The thermal energy next follows a second conduction path (111) from the module connector (101) into the printed wire assembly (102) of the set-top box (105). From the printed wire assembly (102), the thermal energy is released by convection (113) into the ambient air within the set-top hosing or chassis (103). The heat within the chassis may escape through convection (115) from the exterior of the chassis (103). Alternatively, the chassis (103) may include an exchange path (114), such as a vent in the chassis (103) with or without a fan, through which heat can escape from the interior of the chassis (103).

In addition to this primary heat dissipation path, thermal energy generated by the removable module (100) is secondarily dissipated through convection (112) into the ambient air within the set-top box chassis (103). Heat leaving the module (100) in this manner is then further dissipated by convection (115) from the exterior of the chassis (103) or through the exchange path (114).

This system for managing the thermal energy generated by the module (100), while operational, does not provide sufficient cooling of the module (100). Therefore, there has been a need for an improved method and apparatus for managing the thermal energy generated by the operation of a removable module in a set-top box of a cable television system. This need was addressed in U.S. application Ser. No. 09/450,342 filed Nov. 29, 1999, of which the present application is a continuation-in-part and with which the present application is commonly assigned.

In U.S. application Ser. No. 09/450,342, a novel thermal energy management system was proposed in which the removable module (100) was brought into physical contact with the host chassis (103). This contact can be achieved by forming an extended portion of the chassis (103) that contacts the module (100) when the module (100) is inserted in the port (104). Alternatively, the desired contact can be achieved by providing a thermally conductive material between the module (100) and the chassis (103) when the module (100) is inserted in the port (104). In either case, heat generated by the module is dissipated by conducting directly into the host chassis (103) and then convecting away from the chassis (115). This mode of heat dissipation supplements the conventional heat dissipation scheme illustrated in FIG. 1.

However, as cable television systems become even more popular and offer a wider range of electronic data services to subscribers, it is anticipated that the conventional set-top terminal will be replaced by equivalent circuitry that is directly integrated into the subscriber's television set. Thus, the need for a television set and a separate set-top terminal may eventually be eliminated.

Obviously, all the concerns about securing a module in a port in a set-top terminal, as described above, including the problem of thermal management will still apply when the set-top terminal is integrated into a television set. However, the chassis (103) of the set-top terminal (105) will be eliminated as the connector (101) and PWA (102) are brought within the housing of the television set. Consequently, there is a need in the art for a method and apparatus of managing thermal energy generated by a removable module inserted in a port in a television set in order to connect to the signal processing circuitry typically provided in a separate set-top terminal.

SUMMARY OF THE INVENTION

It is an object of the present invention to meet the above-described needs and others. Specifically, it is an object of the present invention to provide an improved method and apparatus of managing thermal energy generated by a removable module inserted in a port in a television set in order to connect to the signal processing circuitry within the television set typically provided in a separate set-top terminal.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve these stated and other objects, the present invention may be embodied and described as a system for managing thermal energy produced by a removable module deployed in electrical connection with circuitry incorporated into a television set. The system preferably includes a port in the television set for receiving the removable module; and a module connector in the port for electrically connecting the module to the circuitry incorporated into the television set. The module, when deployed in the port, is thermally coupled for thermal conduction of heat to a thermally-conductive shield element of the television set. Heat generated by the module is, therefore, primarily dissipated by conduction to the shield element.

In a first preferred embodiment, the system includes a guide disposed in the port for guiding the module into connection with the module connector. The guide is is made of a thermally conductive material and is in physical contact with the module, when deployed, and the shield element, thereby providing the thermal coupling between the module and the shield element. In a second preferred embodiment, the module, when deployed, is in direct physical contact with the shield element.

The television set of the present invention may include either a cathode ray tube or a flat panel display. In the case of a cathode ray tube television set, the shield element that is thermally coupled to the removable module can be the electromagnetic interference shield disposed around the cathode ray tube. In the case of a flat panel display television set, the shield element that is thermally coupled to the removable module can be the shield bracket that supports and shields the flat panel display element of the television set.

The circuitry in the television set to which the removable module is connected may be the same type of circuitry typically placed in a set-top terminal, i.e., circuitry for processing and, if necessary, decrypting an input television signal.

This eliminates the need for a separate set-top terminal with the television set of the present invention.

The present invention also encompasses the methods of using and making the system described above. For example, the present invention expressly encompasses a method for managing thermal energy produced by a removable module deployed in electrical connection with circuitry incorporated into a television set by thermally coupling the removable module for thermal conduction of heat to a thermally-conductive shield element of the television set when the module is received in a port in the television set for electrically connecting the module to the circuitry incorporated into the television set, whereby heat generated by the module is primarily dissipated by conduction to the shield element.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

Using the drawings, the preferred embodiments of the present invention will now be explained.

Figure 1:
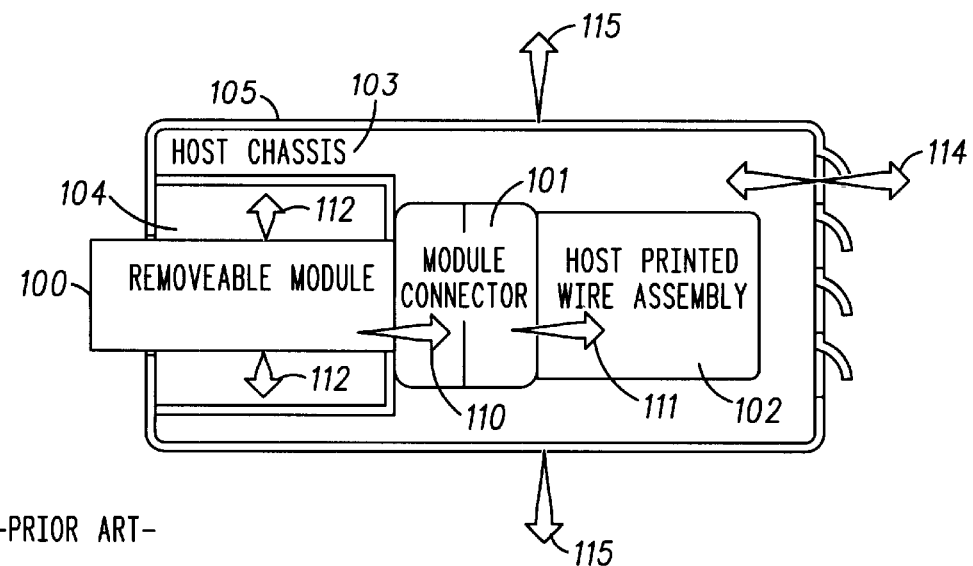
FIG. 1 is a block diagram of a conventional thermal energy management system in a set-top box.
Figure 2:
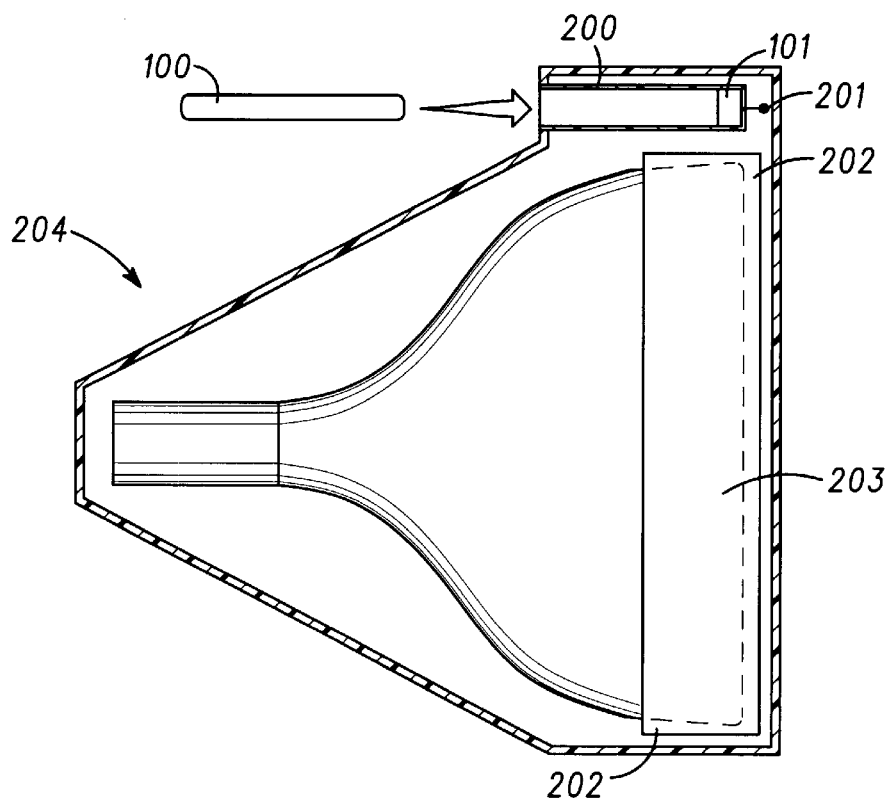
FIG. 2 is a block diagram of a first embodiment of the present invention in which heat from a removable module is dissipated through the electromagnetic interference shield of a cathode ray tube television set.

As shown in FIG. 2, the present invention may be implemented in a television set (204). The television set (204) uses a cathode ray tube (203) as the display device. As is known in the art, an electron gun fires a stream of electrons from the narrow neck of the tube (203) to the flat display surface. The electron beam is regulated in response to the video signal being displayed on the television set. Where the beam strikes the flat display surface of the tube (203), phosphor coated on the surface responds by luminescing to create the image carried by the video signal.

The electron beam is deflected to scan across the flat display surface of the cathode ray tube (203) using a magnetic field. Consequently, if any other magnetic fields are present, they may degrade the resulting picture on the tube (203). Consequently, an electromagnetic interference shield (202) is installed around the end of the cathode ray tube (203). That portion of the tube (203) extending into the shield (202) is shown in ghost in FIG. 2.

The shield (202) is typically made of metal and prevents ambient electrical and magnetic fields from affecting the display of the video signal input to the television set (204). The shield (202) also provides structural support in some larger television sets. Consequently, the shield (202) has a relatively large surface area which can be used under the principles of the present invention to manage heat generated by a removable point-of-deployment module.

As shown in FIG. 2, the television set (204) of the present invention incorporates circuitry (not shown) that performs a function in connection with a removable module (100). This circuitry may be the processing circuitry typically found in a cable television set-top terminal which is incorporated into the television set (204) to eliminate the need for a separate set-top terminal. As discussed above, it may be necessary to periodically replace programming and/or components for such circuitry in the interests of secured transmission of premium cable programming.

However, the present invention is not so limited. Rather, the present invention can be applied to any removable module inserted in the television set to connect to circuitry for any purpose. For example, the circuitry in the television set (204) to which the module (100) is connected could be, for example, a video game system that receives game programming from various removable modules (100). The removable module may also contain electronic components that tend to become obsolete or wear out more rapidly than others so that placement in a removable module allows for easy replacement or upgrades.

As shown in FIG. 2, a removable module (100) is inserted into a port in the television set (204). The port is defined by a guide (200), which is made of a thermally conductive material, for example metal. The guide (200) guides the insertion of the module (100) to bring the module (100) into connection with the module connector (101). The module connector (101), in turn, connects (201) the module (100) electronically to the circuitry (not shown) in the television set (204).

The guide (200) is in physical contact with the sides of the module (100) when the module (100) is deployed. In fact, it is preferably to design the guide (200) to maximize the surface area of direct physical contact between the guide (200) and the module (100).

When the module (100) is deployed in the guide (200), heat generated by the module (100) will conduct directly into the guide (200). The guide (200) is also in direct physical contact with the electromagnetic interference shield (202) of the television set (204), to as large an extent as is practical. Heat from the module (100) is, therefore, conducted through the guide (200) and into the shield (202). The shield (202) has a much greater surface area than the module (100). Thus, the heat spreads out through the shield (202) and dissipates by convection to the ambient air. This convention is greatly facilitated by the relatively large area of the shield (202) and management of the excess thermal energy generated by the module (100) becomes easy.

Conduction of heat from the module (100) into the shield (202) will be the primary means of dissipating the module's (100) excess thermal energy. However, in addition, heat from the module (100) will also dissipate through conduction into the module connector (101) and attached circuitry followed by convection to the ambient air in the same manner described above.

Figure 4:
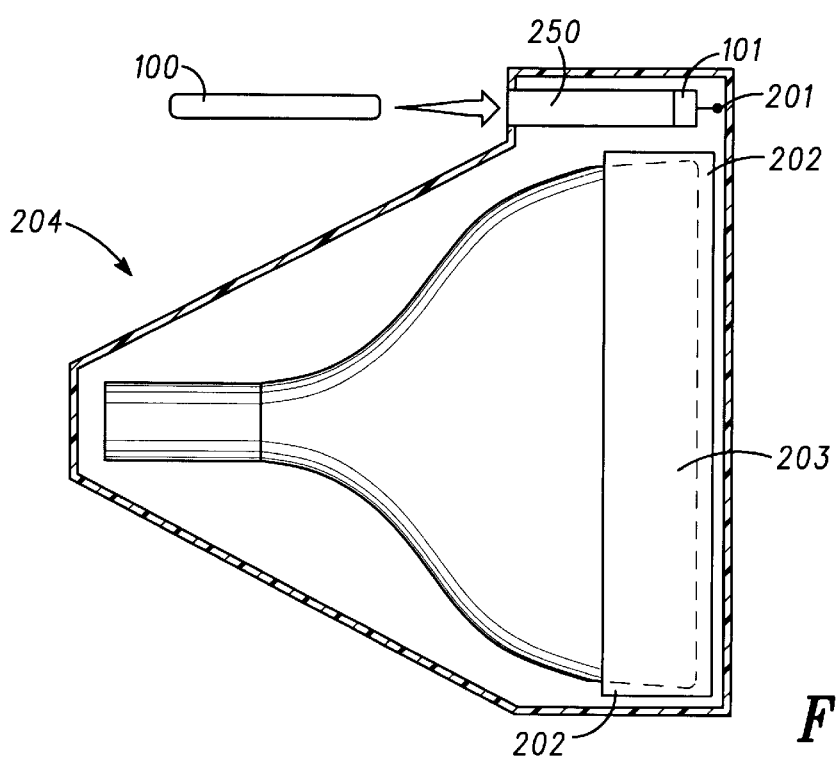
FIG. 4 is a block diagram of a third embodiment of the present invention which is similar to the embodiment of FIG. 2.

Alternatively, as shown in FIG. 4, the port (250) for accepting the module (100) could be designed to bring the casing of the module (100) itself into direct physical contact with the shield (202). In such a case, the invention would operate in an identical fashion only without the mediacy of th guide (200), i.e., heat generated by the module (100) would conduct directly into the shield (202) and then dissipate by convection.

Those skilled in the art will recognize that the guide (200) and/or the module (100) may be incorporated into the television set (204) in a number of orientations. So long as the guide (200) or module (100) has substantial physical contact with the shield (202), heat dissipation according to the present invention can take place. Therefore, any alternate orientation of the guide (200) and/or the module (100) is within the scope of the present invention. Orientations that prevent the deployed module (100) from being accessed too easily by children or unauthorized persons or from being accidentally jarred or dislodged are preferred under the principles of the present invention.

Figure 3:
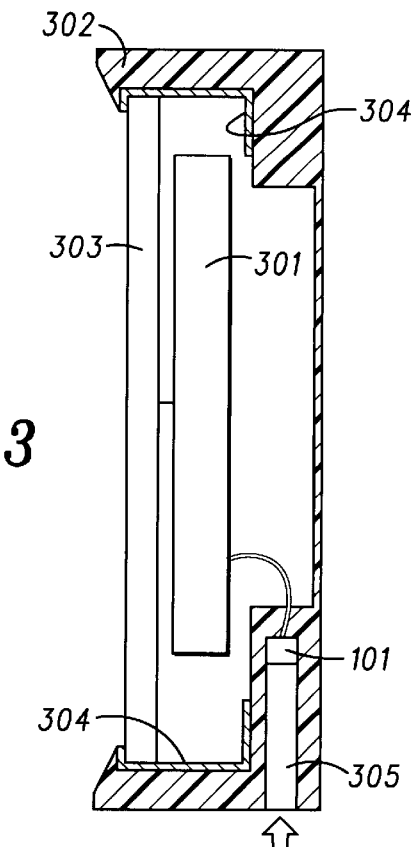
FIG. 3 is a block diagram of a second embodiment of the present invention in which heat from a removable module is dissipated through a shield bracket of a flat panel display television set.

FIG. 3 illustrates an embodiment of the present invention as implemented in a flat panel display television set (300). Current advances in television technology are moving away from the bulky cathode ray tube required in conventional television sets. Flat panel display television sets, for example, liquid crystal display television sets and plasma television sets, are gaining popularity. As used herein, a flat panel television set is any television set that incorporates a relatively flat display element in place of the traditional cathode ray tube.

As shown in FIG. 3, a flat panel television set (300) includes a flat panel display element (303), e.g. a liquid crystal display or a plasma display. The flat panel display element (303) is connected to power supply and processing circuitry (301), typically contained in a separate housing or sub-chassis. The flat panel display element (303) is supported by a shield bracket (304) which function to both support and shield the display (303) in the same manner as the electromagnetic interference shield (202) shown in FIG. 2.

The implementation of the present invention in the flat panel television (300) of FIG. 3 is analogous the implementation of the invention in the cathode ray tube television (204) of FIG. 2. A guide (305) made of heat-conducting material defines a port in the television set (303) for the removable module (100). The guide (305) brings the module (100) into electrical connection with the module connector (101), which is, in turn, connected, to the circuitry (301) of the television set (303).

The guide (305) is in physical contact with both the deployed module (100) and the shield bracket (304) of the television set (300). Consequently, heat from the module (100) will be dissipated primarily by conduction through the guide (305) into the bracket (304). The relatively large surface area of the bracket (304) will then allow for efficient dissipation of the heat by convection.

As described above, the port for accepting the module (100) could be alternatively designed to bring the casing of the module (100) itself into direct physical contact with the shield bracket (304). In such a case, the invention would operate in an identical fashion, only without the mediacy of the guide (305), i.e., heat generated by the module (100) would conduct directly into the bracket (304) and then dissipate by convection.

Those skilled in the art will recognize that the guide (305) and/or the module (100) may be incorporated into the television set (300) in a number of orientations. So long as the guide (305) or module (100) has substantial physical contact with the shield bracket (304), heat dissipation according to the present invention can take place. Therefore, any alternate orientation of the guide (305) and/or the module (100) is within the scope of the present invention. Orientations that prevent the deployed module (100) from being accessed too easily by children or unauthorized persons or from being accidentally jarred or dislodged are preferred under the principles of the present invention.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A system for managing thermal energy produced by a removable module deployed in electrical connection with circuitry incorporated into a television set, the system comprising:

a port in said television set for receiving said removable module; and a module connector in said port for electrically connecting said module to said circuitry incorporated into said television set;

wherein said module, when deployed in said port, is thermally coupled for thermal conduction of heat to a thermally-conductive shield element of said television set; and wherein heat generated by said module is primarily dissipated by conduction to said shield element;

wherein said module, when deployed, is in direct physical contact with said shield element.

2. The system of claim 1, further comprising a guide disposed in said port for guiding said module into connection with said module connector;

wherein said guide is made of a thermally conductive material and is in physical contact with said module, when deployed, and said shield element, thereby providing said thermal coupling between said module and said shield element.

3. The system of claim 1, wherein said television set further comprises a cathode ray tube.

4. A system for managing thermal energy produced by a removable module deployed in electrical connection with circuitry incorporated into a television set, the system comprising:

a port in said television set for receiving said removable module; and a module connector in said port for electrically connecting said module to said circuitry incorporated into said television set;

wherein said module, when deployed in said port, is thermally coupled for thermal conduction of heat to a thermally-conductive shield element of said television set; and wherein heat generated by said module is primarily dissipated by conduction to said shield element;

wherein said television set further comprises a cathode ray tube; and wherein said shield element is an electromagnetic interference shield disposed around said cathode ray tube.

5. The system of claim 1, wherein said television set is a flat panel display television set.

6. A system for managing thermal energy produced by a removable module deployed in electrical connection with circuitry incorporated into a television set, the system comprising:
- a port in said television set for receiving said removable module; and
- a module connector in said port for electrically connecting said module to said circuitry incorporated into said television set;
- wherein said module, when deployed in said port, is thermally coupled for thermal conduction of heat to a thermally-conductive shield element of said television set; and
- wherein heat generated by said module is primarily dissipated by conduction to said shield element;
- wherein said television set is a flat panel display television set; and
- wherein said shield element is a shield bracket of said flat panel display television set.

7. The system of claim 1, wherein said circuitry is set-top terminal comprises circuitry for processing and, if necessary, decrypting an input television signal.

8. A method for managing thermal energy produced by a removable module deployed in electrical connection with circuitry incorporated into a television set, the method comprising thermally coupling said removable module for thermal conduction of heat to a thermally-conductive shield element of said television set when said module is received in a port in said television set for electrically connecting said module to said circuitry incorporated into said television set, whereby heat generated by said module is primarily dissipated by conduction to said shield element;
- wherein said thermal coupling is performed by bringing said module into direct physical contact with said shield element.

9. The method of claim 8, further comprising:
- providing a guide in said port guiding said module into connection with said circuitry, wherein said guide is made of a thermally conductive material and is in physical contact with said module, when deployed, and said shield element;
- wherein said thermally coupling is performed using said guide to thermally couple said module an said shield element.

10. The method of claim 8, wherein said television set further comprises a cathode ray tube.

11. A method for managing thermal energy produced by a removable module deployed in electrical connection with circuitry incorporated into a television set, the method comprising thermally coupling said removable module for thermal conduction of heat to a thermally-conductive shield element of said television set when said module is received in a port in said television set for electrically connecting said module to said circuitry incorporated into said television set, whereby heat generated by said module is primarily dissipated by conduction to said shield element;
- wherein said television set further comprises a cathode ray tube; and
- wherein said shield element is an electromagnetic interference shield disposed around said cathode ray tube.

12. The method of claim 8, wherein said television set is a flat panel display television set.

13. A method for managing thermal energy produced by a removable module deployed in electrical connection with circuitry incorporated into a television set, the method comprising thermally coupling said removable module for thermal conduction of heat to a thermally-conductive shield element of said television set when said module is received in a port in said television set for electrically connecting said module to said circuitry incorporated into said television set, whereby heat generated by said module is primarily dissipated by conduction to said shield element;
- wherein said television set is a flat panel display television set; and
- wherein said shield element is a shield bracket of said flat panel display television set.

14. The method of claim 8, further comprising descrambling a scrambled input television signal using said module.

15. A system for managing thermal energy produced by a removable module deployed in electrical connection with circuitry incorporated into a television set, the system comprising:
- means in said television set for receiving said removable module;
- means for electrically connecting said module to said circuitry incorporated into said television set; and
- means for thermally coupling said module, when deployed, to a thermally-conductive shield element of said television set for conductive thermal transfer between said module and said shield element;
- wherein heat generated by said module is primarily dissipated by conduction to said shield element; and
- wherein said means for thermally coupling said module to said shield element comprise a direct physical contact between said module and said shield element.

16. The system of claim 15, wherein said means for thermally coupling said module to said shield element comprising a guide disposed in said television set for guiding said module into connection with said circuitry; wherein said guide is made of a thermally conductive material and is in physical contact with said module, when deployed, and said shield element, thereby providing said thermal coupling between said module and said shield element.

17. The system of claim 15, wherein said circuitry is set-top terminal comprises means for descrambling a scrambled input television signal.

18. A system for managing thermal energy produced by a removable module deployed in electrical connection with circuitry incorporated into a television set, the system comprising:
- said television set which comprises a cathode ray tube and a thermally-conductive electromagnetic interference shield disposed around said cathode ray tube;
- a port in said television set for receiving said removable module; and
- a module connector in said port for electrically connecting said module to said circuitry incorporated into said television set;
- wherein said module, when deployed in said port, is thermally coupled for thermal conduction of heat to said electromagnetic interference shield of said television set; and
- wherein heat generated by said module is primarily dissipated by conduction to said electromagnetic interference shield.

19. A system for managing thermal energy produced by a removable module deployed in electrical connection with circuitry incorporated into a television set, the system comprising:

said television set which comprises a flat panel display and a thermally-conductive shield bracket for said flat panel display;

a port in said television set for receiving said removable module; and a module connector in said port for electrically connecting said module to said circuitry incorporated into said television set;

wherein said module, when deployed in said port, is thermally coupled for thermal conduction of heat to said shield bracket of said television set; and wherein heat generated by said module is primarily dissipated by conduction to said shield bracket.

20. A system for managing thermal energy produced by a removable module deployed in electrical connection with circuitry incorporated into a television set, the system comprising:

a port in said television set for receiving said removable module; and a module connector in said port for electrically connecting said module to said circuitry incorporated into said television set;

wherein said module, when deployed in said port, is in physical contact with, and thermally coupled for thermal conduction of heat, to a thermally-conductive shield element of said television set; and wherein heat generated by said module is primarily dissipated by conduction to said shield element; and wherein said television set comprises a flat panel display and said shield element comprises a shield bracket for holding said holding said flat panel display.

21. A system for managing thermal energy produced by a removable module deployed in electrical connection with circuitry incorporated into a television set, the system comprising:

a port in said television set for receiving said removable module; and a module connector in said port for electrically connecting said module to said circuitry incorporated into said television set;

wherein said module, when deployed in said port, is in physical contact with, and thermally coupled for thermal conduction of heat, to a thermally-conductive shield element of said television set; and wherein heat generated by said module is primarily dissipated by conduction to said shield element; and wherein said television set comprises a cathode ray tube and said shield element comprises an electromagnetic interference shield disposed around said cathode ray tube.

* * * * *